United States Patent [19]

Mori et al.

[11] 4,116,695

[45] Sep. 26, 1978

[54] METHOD OF PRODUCING A SUPPORT FOR A PRINTING PLATE

[75] Inventors: Teruo Mori; Azusa Ohashi, both of Odawara, Japan

[73] Assignee: Fuji Photo Film Co., Ltd., Minami Ashigara, Japan

[21] Appl. No.: 787,119

[22] Filed: Apr. 13, 1977

Related U.S. Application Data

[63] Continuation of Ser. No. 613,010, Sep. 12, 1975, abandoned.

[30] Foreign Application Priority Data

Sep. 12, 1974 [JP] Japan ................................ 49-105291

[51] Int. Cl.[2] ............................ G03C 1/94; G03F 7/02

[52] U.S. Cl. ........................................ 96/86 P; 96/33; 96/86 R; 96/75; 96/36.3; 204/17; 204/33; 204/35 N; 427/309; 427/320; 427/328; 101/454; 101/456; 101/459; 101/467; 148/6.27

[58] Field of Search .............. 96/33, 36.3, 86 P, 86 R, 96/75; 101/454, 456, 459, 467; 204/17, 33, 35 N; 427/419, 309, 320, 328; 148/6.27

[56] References Cited

U.S. PATENT DOCUMENTS

| | | | |
|---|---|---|---|
| 2,987,417 | 6/1961 | Cochran | 427/419 |
| 3,016,293 | 1/1962 | Cybriwsky et al. | 204/35 N X |
| 3,057,761 | 10/1962 | Wittrock | 204/33 |
| 3,099,610 | 7/1963 | Cybriwsky et al. | 204/35 N |
| 3,891,516 | 6/1975 | Chu | 96/33 X |
| 3,900,370 | 8/1975 | Germscneid et al. | 204/38 A |

OTHER PUBLICATIONS

Wernick et al., "The Surface Treatment and Finishing of Aluminum", 3rd ed., pp. 478–484, (1964).

*Primary Examiner*—Edward C. Kimlin
*Attorney, Agent, or Firm*—Sughrue, Rothwell, Mion, Zinn and Macpeak

[57] ABSTRACT

A method of producing a support for a printing plate comprising treating an aluminum plate, which has been oxidized by anodizing and then etched, with hot water or with water vapor.

21 Claims, No Drawings

METHOD OF PRODUCING A SUPPORT FOR A PRINTING PLATE

This is a continuation of application Ser. No. 613,010, filed Sept. 12, 1975, now abandoned.

BACKGROUND OF THE INVENTION

1. Field of the Invention

This invention relates to a method for producing a support for a printing plate and more particularly to a method for producing an aluminum support for a printing plate in which an undesirable increase in adhesion between the support and a photosensitive material thereon with the passage of time is minimized.

2. Description of the Prior Art

When an aluminum plate having an anodized surface is employed as a support for a printing plate, the adhesion between the support and the photosensitive material provided thereon is generally insufficient, thus the resulting printing plate necessarily does not perform well. Hence the anodized oxide layer is usually etched in order to improve the adhesion between the support and the photosensitive material. For example, phosphoric acid is used to etch an anodized oxide surface layer as is set forth in German patent application OLS No. 2,251,180, Belgian Pat. No. 797,180, etc. Still other etching methods are known whereby various acids other than phosphoric acid and alkalis are used.

It is also known that certain cathodic electrolytic treatments can be used to improve adhesion to an aluminum plate with an anodized surface. However, when an aluminum plate having such an anodized surface which has been further subjected to an etching treatment is used in the production of a photosensitive printing plate, the adhesion between the support and the photosensitive material still gradually increases to such an extent that the developability is deteriorated and that the photosensitive material at the background areas (nonimage areas) tends to remain after development, thus causing background stain in the final printed materials. Particularly when such a printing plate has been stored before use under high temperature and high humidity conditions for a prolonged period, development is not possible at all in some cases.

To overcome these disadvantages in printing plates, the plates are subjected to a so-called "hydrophilic treatment", which is well known in the art.

A hydrophilic treatment includes immersion in various aqueous solutions containing one of sodium silicate, potassium fluorozirconate, phosphate glass, a heavy metal salt, a chromium compound, etc., or coating of a hydrophilic polymer material on the plate as a subbing layer.

Suitable hydrophilic polymer materials for such a purpose include poly(vinylbenzenesulfonic acid), poly(acrylic acid), carboxymethylcellulose, poly(acrylamide), poly(vinyl alcohol), gum arabic, poly(vinylpyrollidone), a poly(ethylene/maleic anhydride) copolymer, etc. Sub-coating can be carried out using an aqueous solution containing at least one of these materials.

The above-described increase in adhesion during storage of a printing plate cannot be completing suppressed even by treatment of the support in the manner described above and, ultimately, the plate begins to exhibit poor developability, giving printed materials with a stained, soiled background.

Further, treating solutions containing sodium silicate, potassium fluorozirconate, or heavy metal salts or chromium compounds have other drawbacks from the standpoint of the difficulty and complications in processing the waste solution for pollution prevention and also potential danger to the operator's health.

SUMMARY OF THE INVENTION

Accordingly, an object of the present invention is to provide a method for treating a support for a photosensitive printing plate to obtain excellent storage stability.

Another object of the present invention is to provide a method for treating a support which can be used to produce a photosensitive printing plate which is free from background staining.

A further object of the present invention is to provide a method of treating a support which is not harmful to human health and with which waste processing is feasible.

As a result of extensive research and investigations as to how to achieve these above-described objects, the present invention has been accomplished. Thus, the present invention provides a method of producing a printing plate comprising treating an anodized aluminum plate, which has been etched, with hot water or water vapor.

DETAILED DESCRIPTION OF THE INVENTION

The aluminum plate for use in the present invention includes plates of pure aluminum and of aluminum alloys. A variety of alloys can be used including these containing silicon, copper, manganese, magnesium, chromium, zinc, lead, bismuth, nickel, etc.. Some representative examples of suitable alloy compositions are shown in the following table. In the table, the values given are percent by weight, with the remainder being aluminum.

| | Compositions of Typical Aluminum Alloys | | | | | |
|---|---|---|---|---|---|---|
| Alloy No. | Si | Cu | Mn | Mg | Cr | Zn |
| 2S | 0.4 | — | — | 0.6 | — | — |
| 3S | — | — | 1.2 | — | — | — |
| 24S | — | 4.5 | 0.6 | 1.5 | — | — |
| 52S | — | — | — | 2.5 | 0.25 | — |
| 61S | 0.6 | 0.25 | — | 1.0 | 0.25 | — |
| 75S | — | 1.60 | — | 2.50 | 0.30 | 5.60 |

These compositions generally include, in addition, small amounts of Fe and Ti and negligible amounts of impurities not shown in the table.

The surface of an aluminum plate is usually subjected to chemical cleaning such as a degreasing with solvents or alkaline agents, as described in detail in *KINZOKU HYOMEN GIJUTSU BINRAN (A Handbook on Metallic Surfaces) p.* 86–210, Nikkan Kogyo Shinbunsha, Tokyo (1969), for the purpose of exposing a clean surface free of grease, rust or dust which is usually present on the aluminum surface. Depending on the requirement, the surface in grained. Suitable graining methods which can be used include glass bead graining, ball graining, sand blasting, brush graining as described in Japanese patent application (OPI) No. 33411/73, electrolytic graining as described in Japanese patent application (OPI) No. 28123/73 and British Pat. No. 896,563, etc. Any of these methods can be employed, however, graining is not always necessary and a polished surface of aluminum can be used as the printing surface of an offset printing support, although a grained support for offset printing exhibits a better water retention, thus giving preferred printed materials. Further, following the graining operation, according to the requirements, a treatment of the aluminum with an aluminum etching agent can be used in order to reduce background staining, as is set forth in Japanese patent application (OPI) No. 49501/73.

Aluminum etching agents typically comprise an acidic solution or an alkali solution, and from the industrial standpoint, alkali solutions, particularly sodium hydroxide, potassium hydroxide, sodium aluminate and sodium phosphate ($Na_3PO_4$) in aqueous solution, are commonly employed. It is common to use the aluminum etching agent at a concentration of from about 0.5 to 100% by weight, preferably about 1 to 50% by weight, based on the weight of the water present, though such is not overly critical. If desired, the aluminum etching agent can contain a small amount of an additive which inhibits scale. This pre-anodization aluminum etching treatment is usually carried out at a temperature of from about 30° to 100° C., preferably about 35° to 90° C., for a period of time of from about 5 to about 600 sec, preferably about 10° to 30° sec. For this processing, in general coating, immersing, spraying or like operations are used to contact the etching agent with the aluminum, and of these, immersing or spraying is most conveniently employed in the present invention because of the simplicity thereof from an industrial viewpoint. U.S. Pat. No. 3,834,998 discloses detailed processing conditions on this pre-anodization etching. This treatment, although not always necessary, is particularly effective when the photosensitive composition employed tends to remain at the background (non-image) areas.

Immersion of thus prepared aluminum plate in a 30% by weight or more, particularly, a 70% by weight, nitric acid aqueous solution for about 20 to 300 sec. is preferred, whereby a further cleaner surface is uncovered.

An anodized oxide layer is then formed on the thus conditioned aluminum plate. When an electric current is passed through the aluminum support immersed as cathode in a solution containing one or more acids selected from sulfuric acid, phosphoric acid, chromic acid, oxalic acid, sulfamic acid, benzenesulfonic acid, etc., an anodized oxide coating is form on the surface of the aluminum support.

Typical anodizing conditions, of course, depend on the composition of the electrolytic solution used and thus cannot be defined unequivocally. In general, suitable anodizing conditions are as follows: acid concentration: about 1 to 80% by weight; temperature of solution: about 5° to 70° C.; current density: about 0.5 to 60 amp/dm$^2$; voltage: about 1 to 100 volts; period of electrolysis: about 30 sec to 50 min. Suitable anodizing procedures are disclosed in, for example, U.S. Pat. Nos. 3,808,000; 3,181,461, 3,280,734; and 3,511,661. The following table summarizes suitable processing conditions in greater detail.

| Electrolytic Solution | Solution Concentration (%) | Solution Temperature (° C) | Current Density (A/dm$^2$) | Voltage (V) | Period (min) |
|---|---|---|---|---|---|
| Sulfuric Acid | 1-70 | 5-65 | 0.5-30 | 1-50 | 1-30 |
| Oxalic Acid | 1-20 | 20-60 | 0.5-20 | 10-70 | 5-40 |
| Phosphoric Acid | 2-60 | 20-60 | 0.5-20 | 10-60 | 1-30 |

-continued

| Electrolytic Solution | Solution Concentration (%) | Solution Temperature (° C) | Current Density (A/dm$^2$) | Voltage (V) | Period (min) |
|---|---|---|---|---|---|
| Chromic Acid | 2-30 | 30-60 | 0.5-10 | 10-60 | 1-50 |

The resulting aluminum support having an anodized oxide coating thereon as a result of the anodic oxidation is subjected to an etching operation either by immersing the support in an acid or alkaline solution or by cathodic electrolysis in one of these solutions.

Suitable solvents for the acid or alkaline solution include both water and organic solvents, although water is typical.

Suitable acid materials include inorganic acid materials such as phosphoric, hydrochlorous, hypobromous, hypoiodous, chlorous, bromous, iodous, bromic, iodic, hydrofluoric, permanganic, nitric, perchloric, hydrocyanic, sulfuric, chromic, carbonic, sulfurous, silicic, fluorozirconic, boric, phosphoric, hypophosphoric, thiocyanic, and molybdic acid, alkali metal hydrogen sulfates, metaphosphoric, pyrophosphoric and polyphosphoric acid, etc., organic acids such as acetic, formic, oxalic, citric, lactic, propionic, oleic, malonic, tartaric, and malic acid, etc., and mixture thereof.

On the other hand, examples of suitable alkaline agents which can be used include strong bases such as sodium hydroxide, potassium hydroxide, lithium hydroxide, barium hydroxide, calcium hydroxide, magnesium hydroxide, sodium aluminate, aqueous ammonium, a salt of a strong alkali and a weak acid such as sodium phosphate ($Na_3PO_4$), potassium phosphate ($K_3PO_4$), sodium carbonate, etc., and mixtures thereof.

The etching solution can also contain a metal salt, a scale preventing agent, or a surface active agent as additives or a third component.

The preferred range of etching should correspond to from about 5 to 75% by weight based on the total weight of the anodized oxide coating, and more suitably from about 10 to 65%. The etching operation can be accomplished by immersion, dipping, spraying, coating, etc., operations; immersion is particularly preferred. For instance, suitable etching conditions, although incapable of being defined unequivocally, lie generally in the following range in the case of an immersion operation; concentration of acid or base; about 0.5 to 100% by weight; processing temperature; about 10° to 95° C.; and processing period; about 1 sec. to 10 min; a more preferable range is 1 to 50% by weight for the solution concentration, 15° to 80° C. for the processing temperature and 2 sec. to 5 min. for the processing period.

The operating conditions for cathodic electrolysis, again which cannot be defined unequivocally since they depend on the composition of the electrolytic solution used and particularly on the kind of acid or base employed, generally lie between about 0.1 and 70% by weight for the concentration of the acid or base, about 0° and 70° C. for the processing temperature, about 1 sec. and 600 sec. for the processing period, and about 0.05 and 20 A/dm$^2$ for the cathodic current density, and more preferably between 0.5 and 30% by weight for the solution concentration, 5° and 40° C. for the temperature, 3 and 300 sec. for the processing period and 0.1 and 10 A/dm$^2$ for the current density, respectively.

For example, the cathodic electrolysis conditions, as described in U.S. patent application Ser. No. 566,576 filed Aug. 4, 1975, now abandoned, the D.C. method, interval method, pulse method, PR (Periodic Reversal) method, A.C. combination method, A.C. and D.C. multiplication method, etc., can be used for the cathodic electrolysis, if desired, as are described in the *Proceedings of the* 48th Scientific Research Meeting of the Society of Metallic Surface Technology p. 14–15, (1973) and also in *Kinzoku Hyomen Gijutsu* (Metallic Surface Technology), Vol. 24, p. 34–42 (1973) and Vol. 25, p. 499–504 (1974), published by the Society of Metallic Surface Technology.

The purpose of the present invention can be achieved by treating the thus provided aluminum support having an etched, anodized oxide surface coating with hot water or water vapor.

The types of water which can be used for the present invention include ion exchanged, distilled, natural or city water, with ion exchanged and distilled being preferred. One or more of the organic solvent, an amine compound, an organic acid or an oxyacid salt of phosphorus or boron can be added to the water in an amount of 20% by weight or less, preferably 10% by weight or less, particularly preferably 5% by weight or less, so as to promote the effect of the present treatment and also to sequester the metal ions present in the water. Suitable organic solvents include alcohols such as methanol, propanol, etc., ketones such as acetone, methyl ethyl ketone, etc., and other water miscible solvents such as glycol monoethers, dimethylformamide, dimethyl sulfoxide, etc. Suitable amine compounds include methylamine, diethylamine, triethylamine, ethylenediamine, hexamethylenediamine, monoethanolamine, diethanolamine, triethanolamine, dimethylaminoethanol, isopropylamine, morpholine, etc. Suitable organic acids include sulfosalycilic acid, sulfoacetic acid, sulfobenzoic acid, benzenesulfonic acid, ethanedisulfonic acid, benzenesulfonic acid, naphthalene sulfonic acid, naphtholsulfonic acid, lignosulfonic acid, p-toluenesulfonic acid, acetone dicarboxylic acid, ethylmalonic acid, citric acid, glycolic acid, malonic acid, adipic acid, etc. Suitable oxyanid salts of phosphorus or boron include disodium phosphate, monosodium phosphate, dipotassium phosphate, monopotassium phosphate, diammonium phosphate, monoammonium phosphate sodium hexametaphosphate, sodium tripolyphosphate, sodium pyrophosphate, sodium phosphite, sodium borate, etc.

In the two treating methods, i.e., the treating method utilizing hot water and the other treating method using water vapor, the former not only requires simpler equipment but possesses a better operating efficiency. For the hot water treatment, a preferred temperature range lies between about 70° C. and 130° C., more preferably between about 80° and 120° C., and particularly preferably between about 85° C. and about 110° C. (for the hot water treatment, elevated pressure are not generally used; the boiling point of the water is increased to over 100° C. by additives to the water) with a treating period from about 10 sec. to 30 min., and preferably from about 15 sec. to 10 min; and with a pH of the hot water of from about 2 to 11, preferably from about 3 to 10, and more preferably from about 4 to 9.5. In the case of water vapor treatment, a suitable temperature ranges from about 100° to 150° C. and more preferably from about 105° to 120° C. Suitable ranges for the treating period and the pH are the same as those for the hot water treatment. If water vapor at an elevated pressure is employed for processing, a pressure of from about 1 to 15 Kg/cm$^2$ and more preferably from about 1.5 to 5 kg/cm$^2$ is suitable.

The aluminum plate produced in accordance with the present invention can be utilized without any further processing as a support for a printing plate due to the excellent hydrophilic property of the surface of the plate and also to the good adhesive affinity to the photosensitive composition coated thereon. Howeve, a further surface treatment, depending on the requirements, can be carried out. One suitable surface treatment method is coating the surface with a subbing layer of a hydrophilic polymeric material such as poly(vinylbenzene sulfonic acid), poly(acrylic acid), carboxymethylcellulose, poly(acrylamide), poly(vinyl alcohol), poly(-vinylpyrolidone), a ethylene/maleic anhydride copolymer, etc. Suitable solvent compositions for the subbing layer composition can be aqueous, organic or mixtures thereof. Organic solvents containing 0 to about 50% by volume of water (the organic solvent being selected from, for example, alcohols such as methanol, ethanol, propanol, etc., ketones such as acetone, methyl ethyl ketone, etc., glycol monoethers such as ethylene glycol monoethylether, ethylene glycol monoethylether, ethylene glycol monomethylether acetate, dimethylformamide, dimethyl sulfoxide, etc.) are particularly suitable. A preferred coating amount of the hydrophilic polymer ranges from about 5 to 150 mg/m$^2$. Two or more of these surface treatments can be employed in combination if desired.

The photosensitive compositions to be provided on the printing plate supports prepared in accordance with the present invention include conventionally well known organic or inorganic photosensitive agents for printing masters, which are sometimes referred to as photo-polymers or photo resists and whose solubility in certain solvents is changed by exposure to light whereby polymerization, cross-linking, dimerization, bond cleavage, decomposition or iosmerization (tautomerization) takes place. Typical examples of suitable compositions are as follows.

(1) Compositions comprising a photosensitive ferric salt such as ferric ammonium oxalate, sodium ferric ammonium citrate ferric oxalate, etc., which upon exposure produce ferrous ion, and a hydrophilic polymer such as gelatin or glue.

(2) Compositions comprising a hydrophilic polymer such as gelatin, fish glue, gum arabic, poly(vinyl alcohol), poly(acrylamide), carboxymethylcellulose, hydroxyethylcellulose, a copolymer of vinyl methyl ether and maleic anhydride, etc., and at least one compound selected from the group consisting of a tetrazonium salt of a diamine compound such as p-amino-diphenylamine, benzidine, dianisidine, toluidine, etc., and a diazo resin resulting from the condensation of p-diazodi phenylamine with paraformaldehyde.

(3) Compositions comprising a diazo resin which is a condensation product of a diazo compound such as p-diazodiphenylamine with paraformaldehyde (for example, as described in U.S. Pat. Nos. 2,649,373, 3,046,121, 3,046,122 and 3,046,123).

(4) Compositions comprising an azide compound such as sodium 4,4′-diazidostilbene-2,2′-disulfonate, sodium 1,5-diazidonaphthalene-3,7-disulfonate, sodium 3′-azide-4-azidobenzalacetophenone-2-sulfonate, sodium 4,4′-diazodostilbene-α-carboxylate, sodium di(4-azido-2′-hydroxybenzal)acetone-2-sulfonate, sodium 4-azidobenzalacetophenone-2-sulfonate, sodium 4,4′-diazidodiphenyl-3,3′-disulfonate, etc., and a polymeric material such as polyacrylamide, poly(vinyl pyrrolidone), poly(acrylic acid), gelatin, casein, albumin, gum arabic, carboxymethylcellulose, hydroxyethylcellulose, a solvent soluble nylon, etc.

(5) Compositions comprising an azide compound and a polymer which is soluble in organic solvents, including azide compounds such as 4,4'-diazidostilbene, 4,4'-diazodichalcone, 4,4'-diazododibenzalacetone, etc., and a polymer which is cyclized rubber or a synthetic rubber.

(6) Compositions comprising a quinone diazide compound such as naphthoquinone-1,2-diazide sulfonic acid or the ester thereof and an alkaline solution soluble resin.

(7) Compounds which undergo dimerization when irradiated with active radiation. Typical compounds include, for example, poly(vinyl cinnamate), poly(vinyl cinnamoyl ethyl ether), poly(cinnamoyl ethyl acrylate), copolymers containing two of these monomeric units, poly(cinnamoyl methacrylate) and copolymers containing the same recurring units, homo and copolymers of p-vinylphenyl cinnamate, poly(vinylbenzal acetophenone) and the derivatives thereof, poly(vinylcinnamylidene acetate) and the derivatives thereof, allyl acrylate prepolymers and the derivatives thereof, a polyester resin derivative comprising p-phenylene diacrylate and a polyhydric alcohol such as is described in U.S. Pat. No. 3,030,208, etc.

(8) Compounds which undergo, upon irradiation with active light, a polymerization reaction, including those having two or more terminal olefinic groups as are described in U.S. Pat. Nos. 2,760,863 and 3,060,023, examples being ethylene glycol diacrylate and dimethacrylate, propylene glycol diacrylate and dimethacrylate, diethylene glycol diacrylate and dimethacrylate, triethylene glycol diacrylate and dimethacrylate, dipropylene glycol diacrylate and dimethacrylate, trimethylolethane triacrylate and trimethacrylate, trimethylolpropane triacrylate and trimethacrylate, tetramethylolmethane tetracrylate and tetramethacrylate, methylene-bis-acrylamide, 1,6-hexamethylene-bis-acrylamide, etc.

A resinous material as a binder, a sensitizer, a thermal polymerization inhibitor, a dyestuff, a plasticizer, etc., can be added to the compounds which undergo dimerization or polymerization when exposed to light. Some examples of suitable binder materials are described in Japanese patent publication No. 8494/60 and 5093/60. Still other materials can be used, including homopolymers and copolymers of vinyl esters, poly(vinyl alcohol), poly(vinyl acetate), poly(vinyl acetate-butyrate), poly(vinyl acetal) such as, for example, poly(vinyl butyral), poly(vinyl formal) and addition polymerization products including recurring units thereof, saturated and unsaturated poly(glycerol ester)s of the so-called alkyd type, and poly(glycerol maleate). These resinous materials can be suitably selected depending on the kind of the photosensitive composition used for the purpose of improving the consistency of the photosensitive resin so as to facilitate the formation of a thin layer.

Descriptions of suitable sensitizers can be found in U.S. Pat. Nos. 2,610,120, 2,670,285, 2,670,286, 2,670,287, 2,697,966, 2,732,301, 2,835,656, 2,956,878, 3,023,100, 3,066,117, 3,141,770, 3,173,787, 3,357,831, 3,409,593, 3,418,295, 3,453,110, 3,475,617, 3,561,969, 3,575,929, 3,583,327, 3,647,470, 3,721,566, and 3,737,319. Particularly useful examples of sensitizers include anthracene, phenanthrene, crysene, o-nitroanisol, β-nitrostyrene, p-nitrodiphenyl, 5-nitro-2-aminotoluene, 4-nitroaniline, 2,4,6-trinitroaniline, 4-nitro-2-chloroaniline, anthrone, 1-cyano-2-keto-3-methyl-6-bromo-3-azobenzanthrone, 2-keto-3-methyl-1,3-diazobenzanthrone, 1,2-benzanthraquinone, β-chloroanthraquinone, dibenzalacetone, Malachite Green, benzoin, benzoin methyl ether, benzoin ethyl ether, 9,10-anthraquinone, 1-chloroanthraquinone, 9,10-phenanthraquinone, leuco triphenylmethane, 2-benzoyl-methylene-1-methyl-β-naphthothiazoline, 5-nitroacenaphthene, β-chloroanthraquinone, 1,2-benzalanthraquinone, p,p'-tetraethylaminodiphenyl ketone, p,p'-dimethylamino-benzophenone, 4-nitro-2-chloroaniline, etc. The amount of sensitizer usually ranges from about 0.5 to 15% by weight based on the above-described dimerizable or polymerizable compound and more preferably from 2 to 8% by weight.

Various pigments such as phthalocyanine blue (C.I. 74160), Carmine 6B (C.I. 15850), Rhodamine B lake (C.I. 45170), etc. and also certain dyes such as oil blue BO (C.I. 74350) can be advantageously used as a coloring material. The preferred range for the coloring material, which obviously depends on other conditions such as those for coating, is from about 1 to 50% by weight and more preferably from 2 to 15% by weight, based on the weight of the photosensitive composition.

Suitable plasticizers include phthalate esters such as dibutyl phthalate, diheptyl phthalate, dioctyl phthalate, etc., glycol esters such as ethyl phthalylethyl glycolate, butyl phthalybutyl glycolate, triethylene glycol dicaprilate, etc., esters of aliphatic dicarboxylic acids such as dioctyl adipate, di-isobutyl adipate, dibutyl sebacate, dioctyl azelate, etc., phosphoric acid esters such as tris-chloroethyl phosphate, tricresyl phosphate, triphenyl phosphate, etc., and glycerol tributyrate, etc. The plasticizer can be used at about 5 and 60%, and more particularly 15 and 40%, by weight based on the weight of the photosensitive composition.

Addition of a printing-out dye to the photosensitive composition is advantageous. Particularly suitable printing out dyes are spyropyran compounds including 6'-nitro-1,3,3-trimethylspyro(indoline-2,2'-2'H-chromene), 8'-formyl-1,3,3-trimethylspyro(indoline-2,2'-2'H-chromene), 6',8'-dichloro-1,3,3-trimethylspyro(indoline-2,2'-2'H-chromene), 8'-methoxy-6'-nitro-1,3,3-trimethylspyro(indoline 2,2'-2'H-chromene), etc. A suitable amount of the print-out dye can range from about 0.5 to 20% by weight, and more preferably 1 to 8% by weight, based on the weight of the photosensitive composition.

The photosensitive coating of the present invention can further include a thermal polymerization inhibitor such as hydroquinone, p-methoxyphenol, 4,4'-thio-bis(3-methyl-6-tert-butylphenol), etc. A suitable amount of the thermal polymerization inhibitor is less than about 10% by weight, preferably less than about 5% by weight, based on the total amount of the photosensitive composition.

Of the different types of photosensitive compositions described above, compositions (4), (7) and (8) are particularly preferred, and the most preferred composition is composition (7).

The photosensitive composition can be provided on the support prepared according to the present invention using procedures of coating in the form of a solution in either water, an organic solvent or a mixture thereof, and drying.

A preferred range for the coating amount of the photosensitive composition generally is from about 0.1 to 3.5 $g/m^2$, and more preferably from about 0.5 to 2.5 to 2.5 $g/m^2$.

A photosensitive lithographic plate thus prepared can be image-wise exposed using a suitable radiation source generating active light including a carbon arc, a xenon lamp, a mercury lamp, an incandescent lamp, a metal halide lamp, etc., and then the plate is developed to obtain a lithographic (hardened printing master)plate.

In the case of producing a lithographic printing plate as described above, exposed areas are hardened (low solubility during development) or unhardened (high solubility during development) and unexposed areas illustrate a converse degree of hardening to the exposed areas, whereby a relief pattern corresponding to the image wise exposure is obtained following development, i.e., the hardened areas (be they exposed or unexposed) are not removed and the unhardened areas are removed (for example, if the exposed areas are hardened, unexposed areas are removed). This pattern can be overcoated, if desired, with a laquer or tincture which shows a stronger adhesion to the support (where the unhardened areas have been removed) than the adhesion between the (hardened) photosensitive composition and the support, so that upon removal of the (hardened) photosensitive areas the laquer or tincture remains, thereby reversing the original relief pattern, if desired.

The adhesion of the support for the lithographic printing plate of the present invention to the photosensitive composition provided thereon is quite stable over an extended period, and, at the same time, excellent abrasion resistance is achived, thus providing a printing plate with a high printing durability. In addition, the present method of producing a lithographic printing support requires simple equipment and can be practiced with a low production cost, which makes the method of the present invention quite advantageous for industrial applications.

The present invention will be further explained in by reference to the following specific examples thereof. Unless otherwise indicated, all parts, percentages, ratios and the like are by weight.

EXAMPLES 1-9

An aluminum plate (material 2S) grained by brushing as is described in the examples of Japanese Patent Application OPI No. 33411/73 was immersed in a 10% sodium hydroxide aqueous solution kept at 55° C. for 20 sec., and then rinsed with water. At this stage the aluminum surface looked grey. A clean, white aluminum surface appeared when this plate was immersed in a 70% nitric acid at room temperature (20° C.) for 60 sec. Anodic oxidation of this aluminum plate was carried out by making the plate the anode and using a lead plate cathode in a 20% sulfuric acid aqueous solution (30° C.) with a D.C. current density of 2 $A/dm^2$ for 3 min. The amount of the oxide coating was 3.0 $g/m^2$.

Then, the anodized aluminum plate was immersed in a 4% phosphoric acid aqueous solution at 70° C. for 30 sec., subjected to the treatment of the present invention, treated with a potassium bichromate solution, a sodium silicate aqueous solution, a nickel acetate aqueous solution, a gelatin aqueous solution, or with a poly(vinyl pyrrolidone), the conditions of each treatment being listed in Table 2.

Then the treated aluminum plate was coated with the following photosensitive coating composition using whirler, and then heated to 100° C. for 2 min.

| | |
|---|---|
| 1,4-Di-β-hydroxyethoxycyclohexane-phenylene Diacrylic Acid Condensate (average molecular weight = 8000) | 10.0 g |
| 5-Nitroacenaphthene | 1.0 g |
| Dibutyl Phthalate | 4.0 g |
| Phthalocyanine Blue | 2.0 g |
| Monochlorobenzene | 300 g |

The coating weight was 1.7 $g/m^2$ on a dry basis.

Additional drying was carried out at 100° C. for 5 min. or for 30 min.

The photosensitive lighographic printing plate thus prepared was contact-exposed through an optically negative original using a 30 A carbon arc placed 70 cm from the plate for 30 sec., and then developed by wiping with a cotton pad soaked with the following developer.

| Developer Composition | | |
|---|---|---|
| 4-Butyrolacetone | 1000 | ml |
| Glycerol | 100 | ml |
| Methyl Abietate | 10 | ml |
| Hydrogenated Wood Resin (Staybelite Resin produced by Hercules Powder Co.) | 1 | ml |
| Wetting Agent (Zonyl A, produced by E.I. DuPont de Nemours, Inc.) | 10.2 | ml |
| Distilled Water | 100 | ml |
| 85% Phosphoric Acid | 25 | ml |

The development performance, the time required for development, and the degree of staining at the non-image area was evaluated at the 1000th print obtained with a "Multilith 1250" printer (a product of Addressograph-Multigraph Corp.) are shown in Table 2. Moreover, the printing plate having the support treated in accordance with the present invention proved capable of providing as many as 30,000 prints which were all of excellent quality, showing no quality degradation from the start of printing.

Table 2

| | | Dry at 100° C, 5 min. | | | Dry at 100° C, 30 min. | | |
|---|---|---|---|---|---|---|---|
| Ex. No. | Treatment Conditions | Development Performance | Development Rate (sec) | Background Staining | Development Performance | Development Rate (sec) | Background Staining |
| Example 1 | 102° C, Water vapor at 3 $Kg/cm^2$ (60)* | Good | 9 | No | Good | 15 | No |
| Example 2 | 95° C, Distilled water (30) | " | 6 | " | " | 12 | " |
| Example 3 | " (120) | " | 5 | " | " | 11 | " |
| Example 4 | 85° C, Deionized water (60) | " | 7 | " | " | 13 | " |
| Example 5 | " (300) | " | 7 | " | " | 14 | " |
| Example 6 | 1% Triethanolamine Aq. Soln. 85° C (30) | " | 9 | " | " | 13 | " |
| Example 7 | 1% Trisodium Phosphate Aq. Soln. 90° C (30) | " | 7 | " | " | 10 | " |
| Example 8 | 1 : 1 Mixture of Solutions in Examples 6 and 7, 90° C (30) | " | 8 | " | " | 11 | " |

Table 2-continued

| Ex. No. | Treatment Conditions | Dry at 100° C, 5 min. Development Performance | Development Rate (sec) | Background Staining | Dry at 100° C, 30 min. Development Performance | Development Rate (sec) | Background Staining |
|---|---|---|---|---|---|---|---|
| Example 9 | 1% Sulfosalicyclic Acid Aq. Soln. 90° C (30) | " | 8 | " | " | 12 | " |
| Comparative Example 1 | 2.0% Sodium Silicate Aq. Soln. 90° C (30) | Poor | 17 | Yes | Poor | 60 | Yes |
| Example 2 | 2.0% Potassium Dichromate Aq. Soln., 90° C (30) | " | 20 | " | Not develop-able | ∞ | " |
| Example 3 | 1.9% Nickel Acetate Aq. Soln. 90° C (30) | " | 23 | " | " | ∞ | " |
| Example 4 | 0.2% Polyvinylpyrrolidone Aq. Soln., 25° C (30) | " | 16 | " | Poor | 50 | " |
| Example 5 | 0.2% Gelatin Aq. Soln. 25° C (30) | " | 18 | " | " | 60 | " |
| Example 6 | — | " | 30 | " | Not develop-: able | ∞ | " |

*Treatment time, in sec.

EXAMPLES 10-18

The same procedures as in Examples 1 to 9 were repeated in the present examples except that a 2% sodium hydroxide aqueous solution was used in place of phosphoric acid. The sodium hydroxide oxide solution was kept at 20° C. and the immersion period was 20 sec. The results obtained are shown in Table 3. The printing plates having a support prepared in accordance with the present invention could be used to produce prints of excellent quality from the start up to 30,000 prints.

Table 3

| Example No. | Treatment Conditions | Dry at 100° C, 5 min. Development Performance | Development Rate (sec) | Background Staining | Dry at 100° C, 30 min. Development Performance | Development Rate (sec) | Background Staining |
|---|---|---|---|---|---|---|---|
| Example 10 | 102° C, Water Vapor at 3 Kg/cm$^2$ (60)* | Good | 9 | No | Good | 15 | No |
| Example 11 | 95° C Distilled Water(30) | " | 7 | " | " | 11 | " |
| Example 12 | " (120) | " | 5 | " | " | 9 | " |
| Example 13 | 85° C Deionized Water(60) | " | 11 | " | " | 12 | " |
| Example 14 | " (300) | " | 7 | " | " | 9 | " |
| Example 15 | 1% Triethanolamine Aq. Soln. 85° C (30) | " | 8 | " | " | 13 | " |
| Example 16 | 1% Trisodium Phosphate Aq. Soln. 90° C (30) | " | 7 | " | " | 11 | " |
| Example 17 | 1:1 Mixture of Solutions of Examples 6 and 7, 90° C (30) | " | 7 | " | " | 12 | " |
| Example 18 | 1% Sulfosalicyclic Acid Aq. Soln. 90° C (30) | " | 8 | " | " | 13 | " |
| Comparative Example 7 | 2.0% Sodium Silicate Ag. Soln. 90° C (30) | Poor | 25 | Yes | Not develop-able | ∞ | Yes |
| Example 8 | 2.0% Potassium Dichromate Aq. Soln. 90° C (30) | " | 30 | " | " | " | " |
| Example 9 | 1.9% Nickle Acetate Aq. Soln. 90° C (30) | " | ∞ | " | " | " | " |
| Example 10 | 0.2% Polyvinylpyrrolidone Aq. Soln., 25° C (30) | " | 20 | " | Poor | 30 | " |
| Example 11 | 0.2% Gelatin Aq. Soln. 25° C (30) | " | 23 | " | " | 60 | " |
| Example 12 | — | Not develop-able | ∞ | " | Not develop-able | ∞ | " |

*Treatment time, in sec.

EXAMPLES 19-27

As described in Example 1, electrolysis was carried out with an grained aluminum plate as the anode in an aqueous solution containing oxalic acid and potassium oxalate, each at a concentration of 0.25 mole/1, at 54° C. with a current density of 2 A/dm$^2$ for 4 min. A lead cathode was used. The amount of the anodized oxide coating was 3.2 g/m$^2$. The aluminum plate thus anodized was immersed in a 1% fluorozirconic acid aqueous solution for 30 sec. at 20° C., rinsed with water, dried, and then subjected to one of the various treatments in a similar manner as in the foregoing examples. Further, coating, drying, image exposure and development were carried out and development performance, development velocity, and background staining during printing were investigated, the results of which are tabulated in Table 4.

A printing plate having the support treated in accordance with the present invention proved capable of providing as many as 30,000 prints, all of which were of excellent quality, showing no quality degradation from the start of printing.

Table 4

| Ex. No. | Treatment Conditions | Dry at 100° C, 5 min. Development Performance | Development Rate (sec) | Background Staining | Dry at 100° C, 30 min. Development Performance | Development Rate (sec) | Background Staining |
|---|---|---|---|---|---|---|---|
| Example 19 | 102° C, Water Vapor at 3 Kg/cm$^2$ (60)* | Good | 12 | No | Good | 15 | No |
| Example 20 | 95° C Distilled Water (30) | " | 7 | " | " | 9 | " |

Table 4-continued

| | | Dry at 100° C, 5 min. | | | Dry at 100° C, 30 min. | | |
|---|---|---|---|---|---|---|---|
| Ex. No. | Treatment Conditions | Development Performance | Development Rate (sec) | Background Staining | Development Performance | Development Rate (sec) | Background Staining |
| Example 21 | " (120) | " | 7 | " | " | 9 | " |
| Example 22 | 85° C Deionized Water (60) | " | 8 | " | " | 9 | " |
| Example 23 | " (300) | " | 7 | " | " | 9 | " |
| Example 24 | 1% Triethanolamine Ag. Soln. 85° C (30) | " | 9 | " | " | 12 | " |
| Example 25 | 1% Trisodium Phosphate Aq. Soln. 90° C (30) | " | 8 | " | " | 11 | " |
| Example 26 | 1:1 Mixture of Solutions of Examples 6 and 7, 90° C (30) | " | 8 | " | " | 13 | " |
| Example 27 | 1% Sulfosalicyclic Acid Aq. Soln. 90° C (30) | " | 9 | " | " | 12 | " |
| Comparative Example 13 | 2.0% Sodium Silicate Aq. Soln. 90° C (30) | Not developable | ∞ | Yes | Not developable | ∞ | Yes |
| Example 14 | 2.0% Potassium Dichromate Aq. Soln., 90° C (30) | " | ∞ | " | " | " | " |
| Example 15 | 1.9% Nickle Acetate Aq. Soln. 90° C (30) | Photosensitive coating stripped off | — | " | " | " | " |
| Example 16 | 0.2% Polyvinylpyrrolidone Aq. Soln., 25° C (30) | " | 25 | " | " | " | " |
| Example 17 | 0.2% Gelatin Aq. Soln. 25° C (30) | " | 30 | " | " | " | " |
| Example 18 | — | " | ∞ | " | " | " | " |

*Treatment time, in sec.

While the invention has been described in detail and with reference to specific embodiments thereof, it will be apparent to one skilled in the art that various changes and modifications can be made therein without departing from the spirit and scope thereof.

What is claimed is:

1. A method of producing a printing plate which comprises:
   a. oxidizing an aluminum plate by anodizing;
   b. etching the resulting oxidized aluminum plate;
   c. treating the oxidized, etched aluminum plate with hot water at about 70° C. to 130° C. or with water vapor to form a printing plate support;
   d. applying an unexposed photosensitive material in layer form to the product of step (c), whereby undesirable increased adhesion between the printing plate support and the photosensitive material with the passage of time is minimized.

2. The method of claim 1, wherein the aluminum plate is a plate of pure aluminum or an aluminum alloy.

3. The method of claim 1, wherein the treating is with hot water.

4. The method of claim 3, wherein the treating with hot water is at a temperature ranging from about 70° C. to about 130° C. for a period of about 10 seconds to 30 minutes and with the hot water having a pH of about 2 to 11.

5. The method of claim 1, wherein the treating is with water vapor.

6. The method of claim 5, wherein the treating with water vapor is at a temperature of about 100° to 150° C. for a period of from about 10 seconds to 30 minutes with the water vapor having a pH of about 2 to 11 and under a pressure of about 1 to 15 $Kg/cm^2$.

7. The method of claim 1, wherein the etching is with a solution containing an aluminum etching agent.

8. The method of claim 1, wherein said etching is conducted to a degree corresponding to about 5 to 75% by weight based on the total weight of the anodized oxide coating.

9. The method of claim 7, wherein said etching is conducted to a degree corresponding to about 5 to 75% by weight based on the total weight of the anodized oxide coating.

10. The method of claim 1, wherein said water vapor is at a temperature of from about 100° to 150° C.

11. The method of claim 7, wherein said water vapor is at a temperature of from about 100° to 150° C.

12. The method of claim 1, wherein said aluminum plate is grained prior to said oxidizing.

13. The method of claim 1, wherein said etching is conducted to a degree corresponding to about 10 to 65% by weight based on the total weight of the anodized oxide coating.

14. The method of claim 1, wherein the product of step (c) is coated with a subbing layer of a hydrophilic polymer material prior to step (d).

15. In a method of printing, the improvement which comprises using the printing plate produced by the process of claim 1.

16. The method of claim 1, wherein said unexposed photosensitive material comprises sodium 4,4'-diazidostilbene-2,2'-disulfonate, sodium 1,5-diazidonaphthalene-3,7-disulfonate, sodium 3'-azide-4-azidobenzalacetophenone-2-sulfonate, sodium 4,4'-diazidostilbene-α-carboxylate, sodium di(4-azido-2'-hydroxybenzal)acetone-2-sulfonate, sodium 4-azidobenzalacetophenone-2-sulfonate or sodium 4,4'-diazidodiphenyl-3,3'-disulfonate.

17. The method of claim 1, wherein said unexposed photosensitive material comprises poly(vinyl cinnamate), poly(vinyl cinnamoyl ethyl ether), poly(cinnamoyl ethyl acrylate), copolymers containing two of these monomeric units, poly(cinnamoyl methacrylate) and copolymers containing the same recurring units, homo- and copolymers of p-vinylphenyl cinnamate, poly(vinylbenzal acetophenone) and derivatives thereof, poly(-vinylcinnamylidene acetate) and derivatives thereof, allyl acrylate prepolymers and derivatives thereof or a polyester resin derivative comprising p-phenylene diacrylate and a polyhydric alcohol.

18. The method of claim 1, wherein said unexposed photosensitive material comprises ethylene glycol diacrylate and dimethacrylate, propylene glycol diacrylate and dimethacrylate, diethylene glycol diacrylate and dimethacrylate, triethylene glycol diacrylate and dimethacrylate, dipropylene glycol diacrylate and dimethacrylate, trimethylolethane triacrylate and trimethacrylate, trimethylolpropane triacrylate and trimethacrylate, tetramethylolmethane tetracrylate and tetramethacrylate, methylene-bis-acrylamide or 1,6-hexamethylene-bis-acrylamide.

19. The method of claim 1, wherein prior to oxidzing said aluminum plate is grained, etched and cleaned.

20. The method of claim 19, wherein said etching is with sodium hydroxide and said cleaning is with nitric acid.

21. The method of claim 20, wherein said photosensitive material is a 1,4-di-β-hydroxyethoxycyclohexane-phenylene diacrylic acid condensate.

* * * * *